United States Patent
Jacob

(10) Patent No.: US 8,798,139 B1
(45) Date of Patent: Aug. 5, 2014

(54) DUAL-PIPELINE CABAC ENCODER ARCHITECTURE

(75) Inventor: Rojit Jacob, Sunnyvale, CA (US)

(73) Assignee: Zenverge, Inc., Santa Clara, CA (US)

( * ) Notice: Subject to any disclaimer, the term of this patent is extended or adjusted under 35 U.S.C. 154(b) by 240 days.

(21) Appl. No.: 13/172,773

(22) Filed: Jun. 29, 2011

(51) Int. Cl.
H04N 7/12 (2006.01)
H04N 11/02 (2006.01)
H04N 11/04 (2006.01)

(52) U.S. Cl.
USPC .................................................. 375/240.02

(58) Field of Classification Search
CPC . H04N 7/50; H04N 7/26244; H04N 7/26271; H04N 7/26053; H04N 7/26941
See application file for complete search history.

(56) References Cited

U.S. PATENT DOCUMENTS

| | | | |
|---|---|---|---|
| 7,095,344 B2 | 8/2006 | Sekiguchi et al. | |
| 7,408,488 B2 | 8/2008 | Sekiguchi et al. | |
| 7,535,387 B1 | 5/2009 | Delva | |
| 7,592,937 B1 | 9/2009 | Chang | |
| RE41,729 E | 9/2010 | Sekiguchi et al. | |
| 8,422,552 B2 | 4/2013 | Au et al. | |
| 2004/0017852 A1 | 1/2004 | Garrido et al. | |
| 2005/0219069 A1 | 10/2005 | Sato et al. | |
| 2006/0222063 A1 | 10/2006 | Zhang et al. | |
| 2007/0115154 A1 | 5/2007 | Park et al. | |
| 2007/0205927 A1 | 9/2007 | Sekiguchi et al. | |
| 2007/0230914 A1 | 10/2007 | Garrido et al. | |
| 2007/0279265 A1 | 12/2007 | Cai et al. | |
| 2008/0240233 A1 | 10/2008 | Au et al. | |
| 2009/0096643 A1 | 4/2009 | Chang | |
| 2009/0168868 A1 | 7/2009 | Jahangir | |
| 2009/0196355 A1* | 8/2009 | Kao et al. ................. | 375/240.25 |
| 2009/0296806 A1 | 12/2009 | Hsu et al. | |
| 2010/0007532 A1 | 1/2010 | Tanaka et al. | |
| 2010/0007534 A1 | 1/2010 | Girardeau, Jr. | |
| 2010/0054328 A1* | 3/2010 | Nozawa ................... | 375/240.01 |
| 2010/0259427 A1 | 10/2010 | Otsuka | |
| 2011/0102213 A1 | 5/2011 | Sekiguchi et al. | |
| 2011/0148674 A1 | 6/2011 | Sekiguchi et al. | |
| 2011/0228858 A1 | 9/2011 | Budagavi et al. | |
| 2011/0280314 A1 | 11/2011 | Sankaran et al. | |
| 2011/0285560 A1* | 11/2011 | Chang et al. .................. | 341/107 |
| 2011/0310958 A1 | 12/2011 | Sachdeva et al. | |
| 2011/0310966 A1 | 12/2011 | Sankaran | |
| 2012/0057637 A1 | 3/2012 | Flachs et al. | |
| 2012/0081242 A1 | 4/2012 | He et al. | |
| 2012/0082218 A1 | 4/2012 | Misra et al. | |
| 2012/0093226 A1 | 4/2012 | Chien et al. | |

(Continued)

Primary Examiner — Dave Czekaj
Assistant Examiner — Nam Pham
(74) Attorney, Agent, or Firm — Fenwick & West LLP

(57) ABSTRACT

A method and system are disclosed for the lossless compression of video data in a synchronous pipelined environment. One or more syntax elements of video data are binarized into one or more ordered bins. A first context model associated with a first bin and a second context model associated with a second bin are received. The first bin is encoded based on the first context model and the second bin is encoded based on the second context model, both bins being encoded within the same clock cycle. One or more encoded bits are outputted based on encoding the first and second bin. In one embodiment, the first bin is encoded in a first pipeline and the second bin is encoded in a second pipeline. In this embodiment, two bins may be encoded every clock cycle, one per pipeline. Further, in one embodiment, multiple context models are received and one context model is selected by each pipeline for encoding. After encoding, one or more context models may be updated and stored.

23 Claims, 5 Drawing Sheets

(56) References Cited

U.S. PATENT DOCUMENTS

| | | |
|---|---|---|
| 2012/0183055 A1 | 7/2012 | Hong et al. |
| 2012/0224635 A1 | 9/2012 | Kim et al. |
| 2012/0294354 A1 | 11/2012 | Sato et al. |
| 2012/0314771 A1 | 12/2012 | Lim et al. |
| 2013/0027230 A1 | 1/2013 | Marpe et al. |

* cited by examiner

DUAL-PIPELINE CABAC ENCODER ARCHITECTURE

BACKGROUND

1. Field of Art

The disclosure generally relates to video compression, and more particularly, to implementing a context-adaptive binary arithmetic coding (CABAC) compression scheme with a dual-pipeline architecture in a video processing system.

2. Description of the Related Art

The H.264 video coding standard includes several algorithmic improvements upon previous block-oriented motion-compensation-based video codecs. One such improvement is the availability of multiple advanced entropy coding methods. Many forms of entropy encoding, a lossless compression technique, assign codes to data symbols in such a way that the most frequently occurring symbols are represented by the shortest codes, allowing the encoder to make use of the natural redundancy of video signals. One such method is context-adaptive variable length coding (CAVLC), which is employed in the H.264 video coding standard, and is applied after video data has been transformed and quantized. In this scheme, VLC tables for various syntax elements are switched depending on already transmitted syntax elements. Since the VLC tables are designed to match the corresponding conditional statistics, the entropy coding performance is improved in comparison to schemes using a single fixed VLC table.

A higher-density implementation of entropy encoding in H.264 is context-adaptive binary arithmetic coding (CABAC). The CABAC design is based on the key elements of binarization, context modeling and binary arithmetic coding. The usage of arithmetic coding and adaptive codes permits CABAC adaptation to non-stationary symbol statistics. The context modeling is applied to a binary sequence of the syntactical elements of the video data, such as block types, motion vectors, and quantized coefficients. The context modeling of CABAC allows previously coded syntax elements to be used in estimating conditional probabilities, which in turn may be used in switching between estimated probability models to improve entropy coding efficiency.

CABAC offers higher compression efficiency than CAVLC at the expense of much higher computational resource and time requirements. For some H.264 applications, the computational time requirements of CABAC may be too costly to use CABAC encoding. In other applications, the smaller compressed video file size offered by CABAC is required, and prevents the use of CAVLC encoding. Therefore, there is a need for an implementation of an H.264 architecture which offers the high level of data compression of CABAC while simultaneously requiring less time to execute.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

The figures depict an embodiment for purposes of illustration only. One skilled in the art will readily recognize from the following description that alternative embodiments of the structures and methods illustrated herein may be employed without departing from the principles described herein.

DETAILED DESCRIPTION

The Figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

H.264 Video Encoder Overview

Figure 1:
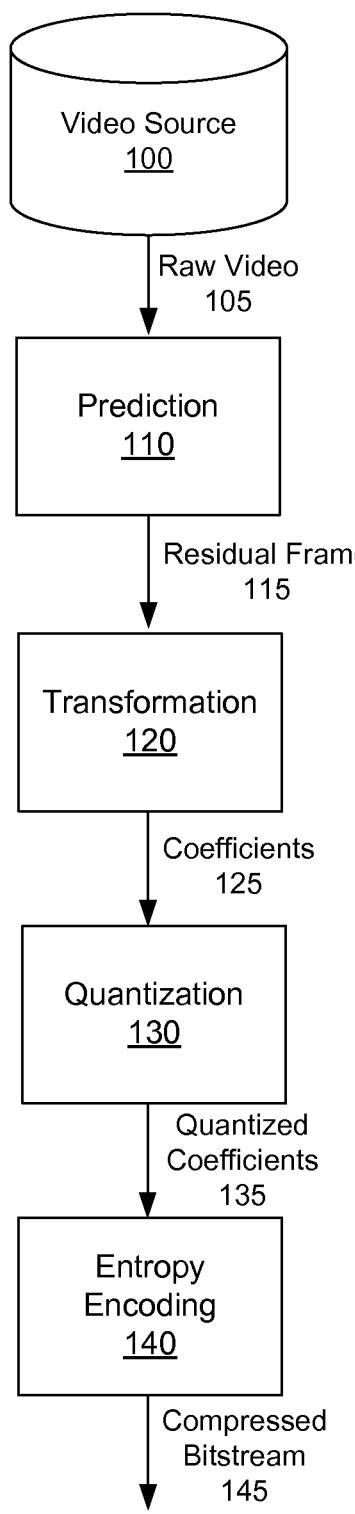
FIG. 1 is a high-level flow chart illustrating a method of encoding video data using an implementation of an H.264 video encoder according to one embodiment.

FIG. 1 is a high-level flow chart illustrating a method of encoding video data using an implementation of an H.264 video encoder according to one embodiment. Generally, an H.264 encoder receives raw video data 105 from a video source module 100 and performs the steps of prediction 110, transformation 120, quantization 130, and entropy encoding 140. The video source module 100 may comprise a computer hard drive, computer memory, flash memory card, or any other means of storing digital video data. The video source module 100 may be local to the H.264 video encoder, or may be external and accessible over a network. The modules performing prediction 110, transformation 120, quantization 130 and entropy encoding 140 as well as the video source 100 may be implemented in a single module or device, or may be implemented in multiple modules or devices. In addition, the functionalities of these modules may be implemented in fewer or additional modules than the ones shown in FIG. 1. Additional functionalities not shown may also be implemented in an H.264 encoder.

Raw video data 105 is transmitted from the video source 100 to a prediction module 110. Raw video data 105 may be video data is any format, whether uncompressed, previously compressed, or otherwise. The raw video data 105 may comprise information describing the video's general display characteristics (such as the video's size, length, resolution, or screen proportions), information describing the video's frame-specific display characteristics (such as pixel color information, pixel location information, brightness, opacity, block and macroblock dimensions and frame location, or any other pixel-domain information), or meta-data describing the video (such as the video title, publisher, publishing date, or keywords describing categorical characterizations of the video content). Raw video data 105 may be in frame format, comprising one or more plurality of still images each composed of pixel information, which when displayed consecutively form motion video.

Prediction module 110 receives one or more frames of raw video data 105 and produces one or more residual frames 115. The process of prediction typically comprises receiving an input frame of video, determining a prediction image similar to the input frame of video, and subtracting the prediction image from the input frame of video to produce a residual frame of video. The residual frame of video typically comprises less data than the input frame of video and thus is easier to encode and compress. Subtracting a prediction image from an input image typically comprises subtracting the pixel information of the prediction image from the pixel information of the input image, resulting in a residual image composed of pixel information representing the difference of the subtraction. Either the received input frame or the produced residual frame 115 may be comprised of macroblocks, which in one embodiment may comprise 16-by-16 squares of pixels.

Prediction module 110 may utilize spatial prediction (identifying objects, shapes, curves, lines, or any other characteristic of a single image similar to a prediction image), temporal prediction (identifying characteristics of precedent or subsequent frames, such as the motion of an object), or any other suitable method to determine a prediction image for a raw video data 105 image. The prediction image may come from a dictionary or library of reference images available to both the encoder and decoder. Alternatively, the prediction image may come from a previously encoded frame, or a frame which will be encoded in the future. Each prediction image may be comprised of one or more than one prediction sub-images. For instance, prediction module 100 may determine a first prediction image for the background of an input image and a second prediction image for an object in the foreground of the input image. The term "prediction image" thus may encompass the combination of all prediction sub-images into a single image. Prediction module 100 then subtracts the prediction image from the raw video data 105 image and outputs residual frame 115.

Transformation module 120 receives residual image 115 in pixel form, processes the residual image 115 and outputs residual image coefficients 125 (the residual image in the transform domain). Transformation module 120 may apply a discrete cosine transform (DCT), a wavelet transform, or any other Fourier-related transform to the received residual image 115. In one embodiment, transformation module 120 processes one macroblock of residual frame at a time, producing one set of coefficients for each processed macroblock. In embodiment, one coefficient is produced for each pixel of residual image 115.

Quantization module 130 receives coefficients 125, quantizes the coefficients 125 and outputs quantized coefficients 135. The quantization of coefficients 125 typically results in many higher frequency coefficients being rounded to zero, reducing the storage space required to maintain the coefficients. Quantization module 130 may compress the range of received coefficients 125 to a single quantum value to produce quantized coefficients 135. In one embodiment, quantization module 130 divides the received coefficients by a selected quantization matrix, and the resulting quotients are rounded to the nearest integer to produced quantized coefficients 135.

Entropy encoding module 140 receives quantized coefficients 135, compresses the coefficients, and outputs compressed bitstream 145. Entropy encoding module 140 utilizes a lossless compression method, such as CAVLC or CABAC. Entropy encoding module 140 may perform incremental encoding, outputting one or more bits at a time as the received quantized coefficients 135 are being compressed. In addition to compressing received quantized coefficients 135, entropy encoding module 140 may compress any syntax element. Syntax elements comprise (in addition to quantized coefficients 135), information which enables a decoder to re-create the prediction, information about the structure of the compressed data, information about the encoded video sequence, information about the compression tools used during encoding, or any other information which describes the video or the encoding and compression process. The compressed bitstream 145 may be transmitted to a decoder for decoding and playback.

An Exemplary Computing System for the H.264 Video Encoder

Figure 2:
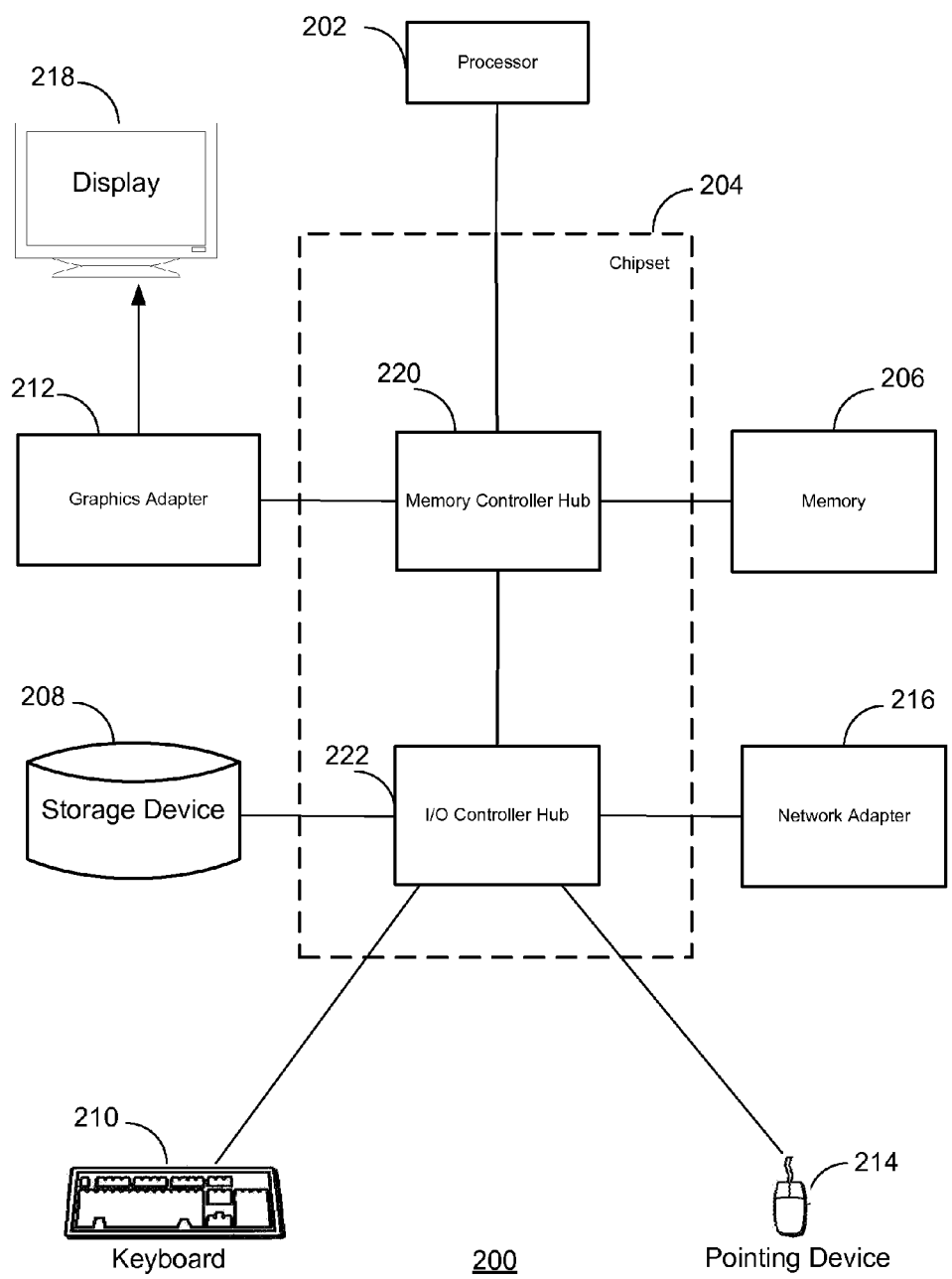
FIG. 2 is high-level block diagram illustrating a typical environment for implementing an H.264 encoder according to one embodiment.

FIG. 2 is high-level block diagram illustrating a typical environment for implementing an H.264 encoder according to one embodiment. Illustrated are at least one processor 202 coupled to a chipset 204. Also coupled to the chipset 204 are the memory 206, a storage device 208, a keyboard 210, a graphics adapter 212, a pointing device 214, and a network adapter 216. A display 218 is coupled to the graphics adapter 212. In one embodiment, the functionality of the chipset 204 is provided by a memory controller hub 220 and an I/O controller hub 222, such as in a computer system. In another embodiment, the memory 206 is coupled directly to the processor 202 instead of the chipset 204, or is located within processor 202, such as in a system-on-a-chip environment. Processor 202 may be a special-purpose dedicated processor, such as an ASIC, or a customizable general-purpose processor, such as an FPGA. Processor 202 may also be a commercially available central processing unit (CPU) or graphical processing unit (GPU), with one or more processor cores.

The storage device 208 is any computer-readable storage medium, such as a hard drive, compact disk read-only memory (CD-ROM), DVD, or a solid-state memory device. The memory 206 holds instructions and data used by the processor 202. The pointing device 214 may be a mouse, track ball, or other type of pointing device, and is used in combination with the keyboard 210 to input data into chipset 204. The graphics adapter 212 displays images and other information on the display 218. The network adapter 216 couples the chipset 204 to a network.

In one embodiment, the environment of FIG. 2 is implemented within a computer system. As is known in the art, a computer can have different and/or other components than those shown in FIG. 2. In addition, a computer can lack certain illustrated components. In one embodiment, a computer can lack a keyboard 210, pointing device 214, graphics adapter 212, and/or display 218. Moreover, the storage device 208 can be local and/or remote from a computer (such as embodied within a storage area network (SAN)).

As is known in the art, a computer can be adapted to execute computer program modules for providing functionality described herein. As used herein, the term "module" refers to computer program logic utilized to provide the specified functionality. Thus, a module can be implemented in hardware, firmware, and/or software. In one embodiment, program modules are stored on the storage device 208, loaded into the memory 206, and executed by the processor 202.

Embodiments of the entities described herein can include other and/or different modules than the ones described here. In addition, the functionality attributed to the modules can be performed by other or different modules in other embodiments. Moreover, this description occasionally omits the term "module" for purposes of clarity and convenience.

H.264 CABAC Encoder Overview

Figure 3:
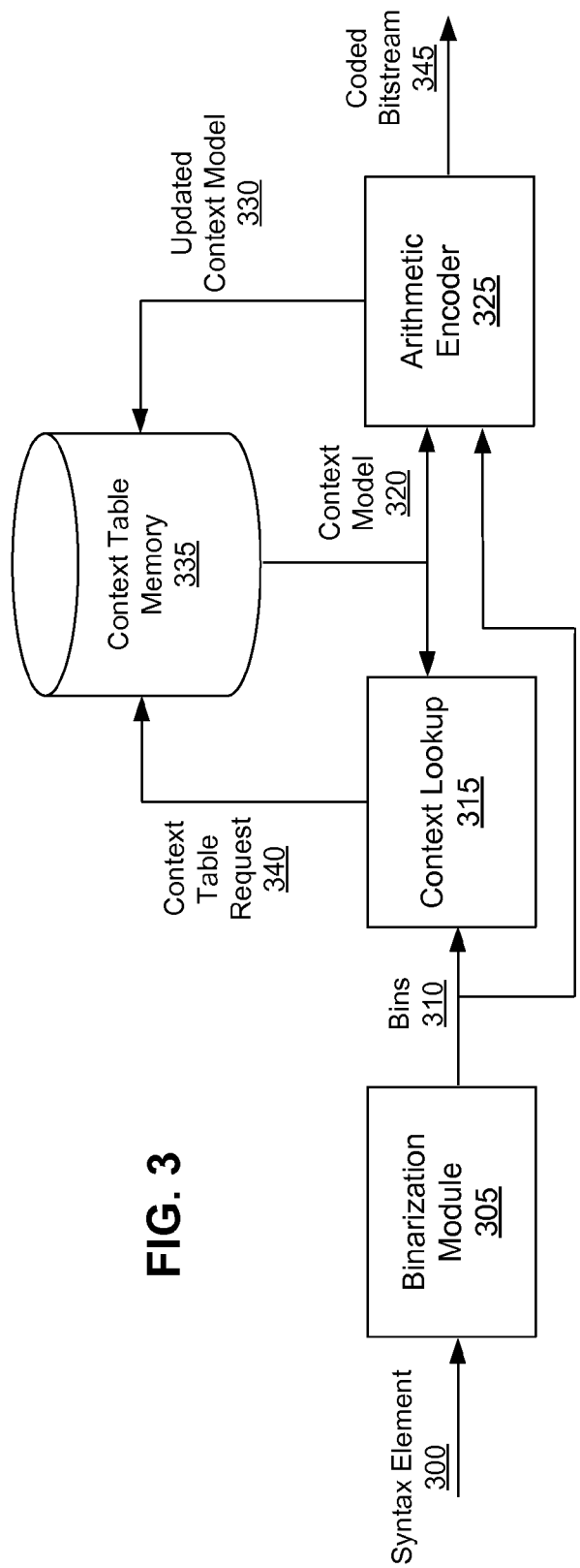
FIG. 3 is high-level block diagram illustrating an H.264 CABAC encoder according to one embodiment.

FIG. 3 is high-level block diagram illustrating an H.264 CABAC encoder according to one embodiment. The CABAC encoder may be implemented by the entropy encoding module 140 in the H.264 video encoding process. The primary components of the exemplary CABAC encoder are the binarization module 305, the context lookup module 315, the arithmetic encoder module 325 and the context table memory 335. Additional or fewer modules may be used to implement CABAC encoding functionality. The CABAC encoder will be described in the context of a single encoding cycle for the purposes of clarity; multiple cycles of encoding may be performed by the CABAC encoding, such as in a pipelined implementation of the CABAC encoder.

The binarization module 305 receives a syntax element 300, performs binarization by converting the syntax element 300 into ordered binary bits, referred to as "bins" 310, and outputs the bins 310. In one embodiment, the syntax element 300 comprises a quantized coefficient, or any of the video information or encoding information discussed above. The syntax element 300 may additionally comprise a syntax element identifier ("syntax element ID") that identifies the syntax element. For instance, the syntax element ID may identify which macroblock a quantized coefficient syntax element 300 belongs to, which portion of the encoded video a quantized coefficient syntax element 300 appears in, or which type of quantization was performed in encoding a video. In one embodiment, the order of the bins of the binarized syntax element must be maintained. For example, the arithmetic encoder 325 may be required to encode the bins in the order that they are outputted by binarization module 305 in order for a decoder to decode the encoded binarized syntax element. Finally, the syntax element 300 may comprise a context model index, identifying a context model to be used in arithmetic encoding.

Bins 310 are individual binary bits representing a received syntax element 300 and may comprise a syntax element ID, identifying the syntax element each bin represents. Alternatively, each bin 310 may include a context model index which identifies a context model associated with each bin 310. The context index may be derived from the syntax element ID, or may be independently derived or received. In one embodiment, the binarization module 305 outputs bins 310 sequentially, for instance, one bin 310 per clock cycle. Alternatively, the binarization module 305 may output multiple bins 310 per clock cycle. In one embodiment, the binarization module 305 transforms the received syntax element 300 into binary form. For instance, the syntax element 300 may be received in integer form, and the binarization module converts the syntax element 300 to binary bins 310.

Context lookup module 315 receives the bins 310 and transmits a context table request 340 to context table memory 335. The context table request 340 may identify the syntax element associated with a received bin 310. In one embodiment, a received bin 310 includes a syntax element ID, and the context lookup module 315 parses this syntax element ID and transmits it with the context table request 340. The context table request 340 may comprise a context model index which may identify a specific context model within context table memory 335, or a specific location within context table memory 335 containing a specific context model. Context lookup module 315 may request a context model from context table memory 335 once for each syntax element, or may request the same context model multiple times for a given syntax element, such as once per received bin. For simplicity, the term "context model" may refer to a singular context model, multiple context models, or a context model word comprising multiple context models stored together.

Context table memory 335 receives the context table request 340 and outputs context model 320 based on the request 340. The context table memory 335 may comprise one or more memory locations and may contain one or more context models per memory location. For instance, each context table memory location may store a context model word comprising 32 context models. In one embodiment, context table memory 335 indexes context models by context model index. The context model index may comprise a memory location and a specific context model stored at that memory location. For example, in one exemplary embodiment, the context model index for context model "14" at memory address "E41C" is "E41C14". The context table memory 335 may be initialized to default values after a set period of time, after encoding a certain number of frames, after encoding a certain number of video slices, or any other suitable time. Reference to a "syntax element's context model" refers to the context model associated with the context model index, the syntax element or the syntax element ID.

The stored context models may comprise a probability that a received bin will be a specific bit, and may comprise any form sufficient to allow arithmetic encoder 325 to encode bins 310. For instance, the stored context models may comprise 7-bit words made up of a 1-bit most probable bit (MPB) and a 6-bit binary probability that a received bin is identical to the MPB. Alternatively, the context models may instead comprise the least probable bit (LPB), the probability that a received bin is identical to the LPB, or any combination of an identified bit and a probability of receiving the identified bit or its inverse. In addition, the context models may be stored in more or fewer than 7 bits in context table memory 335, and probabilities may comprise more or fewer than 6 bits. In one embodiment, context table memory 335 stores an index for each context model and computes the probability component of a context model when that context model is requested.

The context table memory 335 accesses and outputs the requested context model 320 identified by context table request 340. The context model 320 may be transmitted to context lookup module 315 for subsequent transmission to arithmetic encoder 325, or may be transmitted directly to arithmetic encoder 325. Arithmetic encoder 325 receives a context model 320 and a bin 310, and produces an updated context model 330 and a coded bitstream 345. In one embodiment, only one context model 320 is used to encode bins of the same syntax element; alternatively, more than one context model 320 may be used to encode the bins of a given syntax element. The arithmetic encoder 325 adaptively updates context model 320 depending on the content of received bins 310. In one embodiment, the arithmetic encoder 325 updates context model 320 each time a bin 310 is received. While encoding the received bins 310 of a syntax element, arithmetic encoder 325 may maintain updated context model 330 internally, using updated context model 330 to encode each subsequent bin of a syntax element, updating the context model after encoding each subsequent bin. The context models may be updated according to the probability state index transition rules defined in H.264, or may be updated using any suitable adaptive method.

The updated context model 330 may be transmitted to context table memory 335 each time the context model is updated, or after an entire syntax element is encoded. The context table memory 335 may write the updated context model 330 to the memory location of the original context model 320, overwriting the original context model 320. In one embodiment, the updated context model 330 is stalled when context table memory 335 is outputting context model 320. In one embodiment, updated context model 330 is written to another location, such as cache memory, where it is maintained until it can be written to context table memory 335.

Arithmetic encoder 325 uses context model 320 to encode received bins 310. Arithmetic encoder 325 may encode received bins 310 into a single fractional number n, where ($0.0 \leq n < 1.0$). To encode received bins 310, encoder 325 may maintain a numerical interval representing the probability of receiving previously received bins 310. The numerical interval may be have an upper interval limit and a lower interval limit, and may be represented by range R, comprising the difference between the upper interval limit and the lower interval limit. In one embodiment, the numerical interval is initialized to the interval [0, 1] and is updated for each received bin 310. In one embodiment, the maintained interval has an upper interval limit, $R_U$, and lower interval limit, $R_L$, which are updated when encoding a received bin.

In one embodiment, updated $R_U$ and $R_L$ limits are defined by:

$$R_L' = R_L + (R_U - R_L) \times F_X(x_n - 1) \quad (1)$$

and:

$$R_U' = R_L + (R_U - R_L) \times F_X(x_n) \quad (2)$$

In equations (1) and (2), $R_L'$ represents an updated limit of $R_L$, $R_U'$ represents an updated limit of $R_U$, $F_X$ represents the cumulative density function of received bins 310 represented by the context model 320, and $x_n$ represents the values of the random variable corresponding to the received bins 310.

In one embodiment, the probability of receiving a "0" bin $p_0$ is determined from the context model 320. For instance, the context model 320 may provide the MPB and probability of receiving the MPB, p. In the event that the MPB is a "1", then $p_0$ is (1−p). In the event that the MPB is a "0", then $p_0 = p$. The updated interval limits in such an embodiment vary depending on the value of the received bin 310. For a "0" bin, these limits are defined by:

$$R_L' = R_L \quad (3)$$

$$R_U' = R_L + (R_U - R_L) \times p_0 \quad (4)$$

For a "1" bin, these limits are defined by:

$$R_L' = R_L + (R_U - R_L) \times p_0 \quad (5)$$

$$R_U' = R_U \quad (6)$$

The arithmetic encoder 325 may update the maintained interval each time a bin 310 is received. In doing so, the maintained interval $R_I = (R_L, R_U)$ is restricted and gets smaller over time. If at any point in time $R_I$ is completely contained in the intervals $E_1$: [0, 0.5] or $E_2$: [0.5, 1], then $R_I$ may be expanded according to the following definitions:

$$E_1(x) = 2x \quad (7)$$

$$E_2(x) = 2(x - 0.5) \quad (8)$$

In equations (7) and (8), x represents the limits $R_L$ and $R_U$. For example, if $R_I = (0.243, 0.492)$, then $R_I'$ (the updated interval) may be expanded to the interval (0.486, 0.984). Similarly, if $R_I = (0.631, 0.855)$, then $R_I'$ may be expanded to the interval (0.262, 0.710). In the event that after updating $R_I$, $R_I$ is still completely contained in the intervals $E_1$ or $E_2$, the process may be iterated until $R_I$ is no longer completely contained in $E_1$ or $E_2$. For instance, if $R_I = (0.542, 0.689)$, then $R_I'$ may be expanded first to the interval (0.084, 0.378), and a second time to the interval (0.168, 0.756).

In the embodiment described above, each time $R_I$ is updated according to $E_1(x)$ or $E_2(x)$, the arithmetic encoder 325 may output a coded bit. For instance, when $R_I$ is updated according to $E_1(x)$, the arithmetic encoder outputs a "0", and when $R_I$ is updated according to $E_2(x)$, the arithmetic encoder outputs a "1". In one embodiment, arithmetic encoder 325 does not output any bits when $R_I$ isn't updated according to $E_1(x)$ or $E_2(x)$ (for instance, when $R_I$ receives a bin 310, and the resulting updated interval $R_I'$ is not completely contained in the intervals $E_1$ or $E_2$). The arithmetic encoder may output coded bits incrementally as $R_I$ is updated according to $E_1(x)$ or $E_2(x)$, or may output coded bits in groups. The outputted coded bits form coded bitstream 345.

Dual-Pipeline CABAC Encoder Implementation

Figure 4:
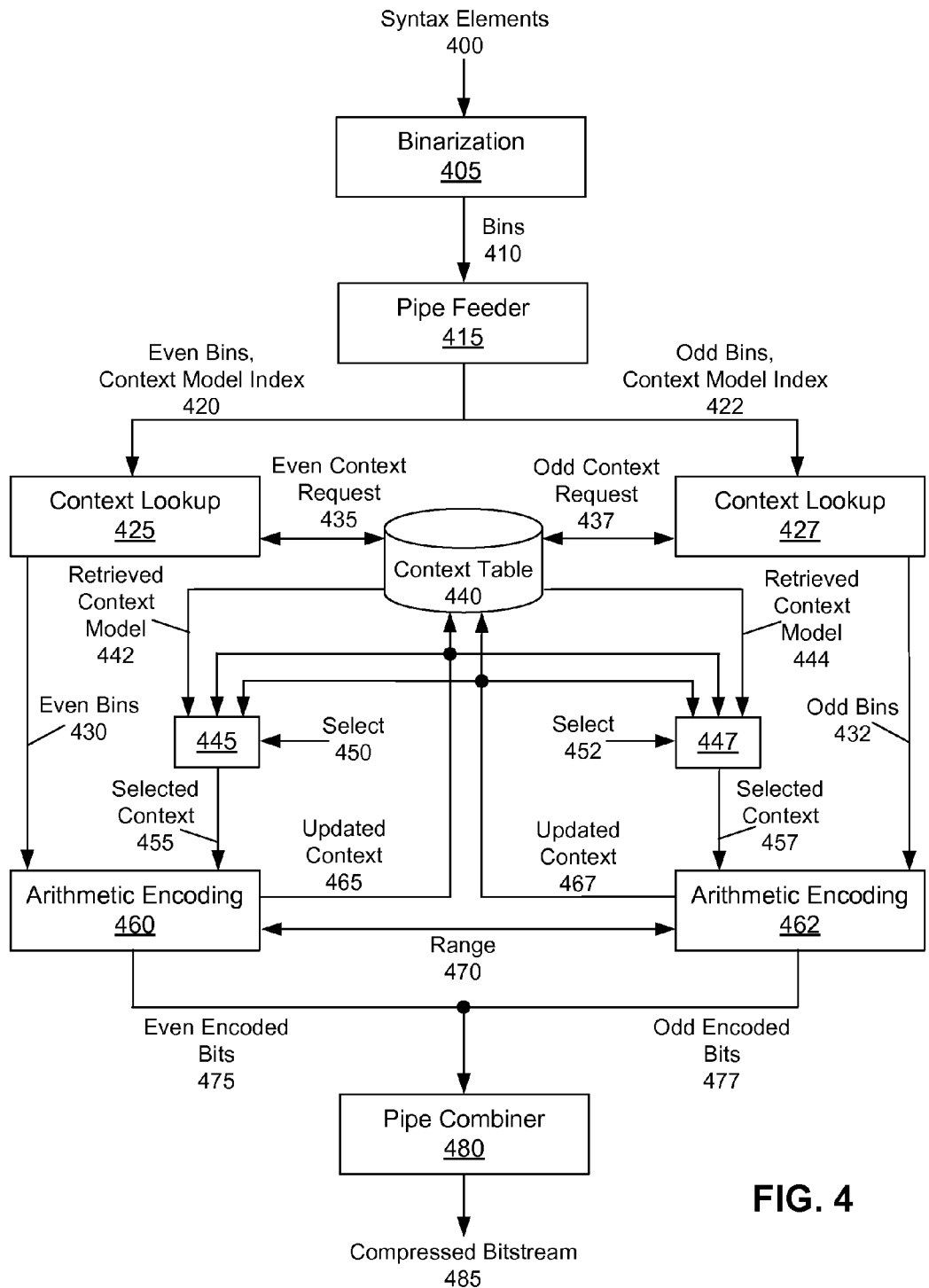
FIG. 4 is a high-level block diagram illustrating a video processing system with a dual-pipeline implementation of an H.264 CABAC encoder according to one embodiment.

FIG. 4 is a high-level block diagram illustrating a video processing system with a dual-pipeline implementation of an H.264 CABAC encoder according to one embodiment. This architecture may be implemented with computer instructions stored on a computer-readable storage medium, executable by a processor. Alternatively, this architecture may be implemented in computer hardware. In one embodiment, the dual-pipeline CABAC encoder architecture is implemented in a special-purpose dedicated processor, such as an ASIC, or a customizable general-purpose processor, such as an FPGA. The dual-pipeline CABAC encoder may also be implemented with a commercially available CPU or GPU, with one or more processor cores, or may be implemented with a system-on-a-chip integrated circuit or a microcontroller. Further, this architecture may be implemented with a combination of chips and/or computer instructions. Finally, this architecture may be implemented with fewer or additional modules, and the described modules may be combined and/or may implement the described functionalities in alternative ways. For simplicity, the processing described herein is described in terms of clock cycles and a synchronous pipelined environment, though this architecture is equally applicable in an asynchronous environment.

Binarization module 405 receives syntax elements 400 and produces bins 410. In one embodiment, the bins 410 are produced using the method described above with respect to FIG. 3. In addition, the bins associated with each syntax element 400 may also be associated with the syntax element ID of each syntax element 400 or a context model index identifying a context model associated with the bins. Pipe feeder module 415 receives the bins 410 and outputs even bins 420 and odd bins 422. The pipe feeder module 415 may receive one or more complete binarized syntax element in a single clock cycle, or may receive one or more bins 410 of one or more binarized syntax element at a time. For instance, pipe feeder module 415 may receive two bins 410 per clock cycle, and may receive two bins 410 in consecutive clock cycles until an entire binarized syntax element is received. In one embodiment, a plurality of syntax elements are binarized consecutively, and binarization module 405 outputs bins 410 until the plurality of binarized syntax elements have been outputted. Pipe feeder module 415 may contain cache memory or other suitable means for storing received binarized syntax elements until they can be outputted.

Pipe feeder module 415 may output two received bins (a "bin pair"), one even bin 420 and one odd bin 422, simultaneously. In one embodiment, two received bins are outputted once each clock cycle until each of the received bins 410 have been outputted. Alternatively, pipe feeder module 415 may output even bins 420 and odd bins 422 in alternating clock cycles, or may stall one or more clock cycles between outputting bins or bin pairs. In one embodiment, pipe feeder module 415 does not alter received bins 410 prior to outputting the bins. The context model index associated with each received bin 410 may be outputted with each bins or bin pair. In one embodiment, context model indexes associated with received bins 410 may be received with received bins 410, or may be received or determined separately. The pipe feeder module 415 may output even bins 420 to context lookup module 425 (the "even pipeline") and odd bins 422 to context lookup module 427 (the "odd pipeline"). In the event that a first binarized syntax element has an odd number of bins, the last bin of the syntax element may be outputted in the same bin pair or on the same clock edge as the first bin of a second binarized syntax element. Alternatively, the last bin of the first binarized syntax element may be outputted in a separate clock cycle than the first bin of the second binarized syntax element.

In one example embodiment, a first syntax element (with context model index "010124") is binarized into a 5-bit word ($x_{[4-0]}$), and second syntax element (with context model index "010120") is binarized into a 4-bit word ($y_{[3-0]}$). Pipe feeder module 415 stores the binarized syntax elements until they are completely outputted as bins 420 and 422. On a first clock edge, bin $x_0$ and context model index "010124" are outputted on the even pipeline to context lookup module 425, and bin $x_1$ and context model index "010124" are outputted on the odd pipeline to context lookup module 427. On the following clock edge, bin $x_2$ and bin $x_3$ (and "010124") are outputted on the even pipeline and odd pipeline, respectively. On the following clock edge, bin $x_4$ and "010124" are outputted on the even pipeline, and bin $y_0$ and "010120" are outputted on the odd pipeline. Bin $y_1$ and bin $y_2$ are outputted with "010120" on the even and odd pipelines respectively on the following clock edge, and bin $y_3$ is outputted with "010120" on the even pipeline on the next clock cycle.

Context lookup modules 425 and 427 receive even bins 420 and odd bins 422, respectively. Context lookup modules 425 and 427 may request a context model from context table 440 in response to receiving bins from pipe feeder module 415. In one embodiment, context lookup modules 425 and 427 transmit requests 435 and 437 for a context model from context table 440 by transmitting the context model index associated with the received bins to context table 440. Requests 435 and 437 may comprise additional signals, such as a "memory read" signal. Context table 440 may comprise a memory as described above with respect to context table memory 335, or may comprise a module which retrieves from an external source or generates context models at the request of context lookup modules 425 and 427 or any other module or entity.

In one embodiment, the context models are indexed by context model indexes. The context model index may be numerical, allowing a context model associated with the context model index to be retrieved when the context model index is received at an address port on context lookup table 440. In alternative embodiments, a received context model index is modified prior to being received at an address port, or the context model index is transmitted to a context table memory address lookup table in order to retrieve the context table address for the associated context model. In addition to an address port, context table 440 may have a read/write port, and may be either written to or read from in a single clock cycle. In an alternative embodiment, context table 440 may have both a read and a write port, and may be read from and written to in a single clock cycle. Similarly, context table 440 may have multiple read and multiple write ports, allowing multiple context models to be read or written in a single clock cycle. Context table 440 may have additional ports necessary for reading, writing, context model management, dual-pipeline architecture management, or any other functionality necessary for a CABAC encoder implementation.

In one embodiment, context lookup modules 425 and 427 only request a context model from context table 440 once per syntax element received. In such an embodiment, context lookup modules 425 and 427 contain logic to determine the first received bin of a binarized syntax element, and the context model associated with the syntax element is retrieved when the first received bin of a binarized syntax element is detected. In this embodiment, the context model associated with the syntax element is only requested from context table 440 once.

In the event that context lookup modules 425 and 427 each receive a bin from the same binarized syntax element, either context lookup module 425 or context lookup module 427 or both may request the context model associated with the binarized syntax element, and either context lookup module or both may receive the requested context model. In the event that context lookup modules 425 and 427 each receive a bin from different binarized syntax elements, context lookup module 425 may request a context model and a one clock cycle stall may be inserted into both pipelines so that context lookup module 427 may request a context model in the next clock cycle. Alternatively, context lookup module 427 may request a context model, and a stall may be inserted into the pipeline so that context lookup module 425 may request a context model in the next clock cycle. In one embodiment, additional logic determines which context model request to transmit to context table 440. For instance, the additional logic may determine that the context model for a first of the two syntax elements was requested or received in the previous clock or in immediately preceding clock cycles, and as a result may transmit only the request for the context model for a second of the two syntax elements. Finally, the context models may be organized in context table 440 in such a way that in all scenarios where different context models may be requested simultaneously, the different context models are located at the same context table 440 address, and thus the different context models can be retrieved in a single memory read.

In one embodiment, both context lookup modules 425 and 427 may request a context model from context table 440. In such an embodiment, both context lookup modules 425 and 427 may receive a context model from context table 440 in the same clock cycle, or both may receive context models in subsequent clock cycles. Context table 440 may only be able to receive one request for a context model at a time; in such instances, additional logic may allow only one request to be transmitted to context table 440. As discussed above, the additional logic may select the request which requests a context model that has not been recently (such as one or a few clock cycles) requested to transmit to context table 440. Context table 440 may output the entire contents of a memory address, which as discussed above, may comprise multiple context models. In one embodiment, the contents of a memory address is outputted in response to a request for a specific context model, and additional logic parses the contents of the memory address and transmits only the requested specific context model to context lookup modules 425 or 427. Likewise, in the event that both context lookup modules 425 and 427 request different context models, if both context models are stored at the same context table 440 address, the additional logic may receive the contents of the memory address and may transmit only the requested context models to context lookup modules 425 and 427. Where context table 440 is described above as transmitting retrieved context models to context lookup modules 425 and 427, context table 440 may instead transmit retrieved context models to mux gates 445 and 447 and retrieved context models 442 and 444, respectively. In addition, if retrieved context models are transmitted to context lookup modules 425 and 427, context lookup modules 425 and 427 may in turn transmit the retrieved context models to mux gates 445 and 447. In one embodiment, instead of transmitting retrieved context models 442 and 444 to mux gates 445 and 447, the retrieved context models are transmitted directly to arithmetic encoders 460 and 462, or to additional logic (not shown in FIG. 4) which selects between multiple received context models.

Context table 440 may receive a request for a context model (a "read request") and a request to update a context model (a "write request") in the same clock cycle. In this event, context table 440 may give preference to either the read request or the write request if the context table 440 is incapable of reading and writing in the same clock cycle. In the event that either the read request or the write request gets priority, the context table 440 may request a pipeline stall so that the reading and writing operations occur in subsequent clock cycles. Alternatively, the context table 440 may allow the read request and may store the updated context model in cache memory until the next clock cycle that the context table 440 does not receive a read request.

Updating a context model within context table 440 may comprise writing an updated context model over a stored context model. The process of arithmetic encoding generally comprises receiving a context model (which as discussed above comprises a probability of a receiving a particular bin) and updating the probability of the context model based on the received bin. For instance, if the context model predicts an 80% chance of receiving a "1", and a "1" is received, the updated context model might be updated to predict an 81% chance of receiving a "1"; likewise, receiving a "0" might result in an updated context model predicting a "79%" of receiving a "1". If context table 440 receives a write request to update a particular context model with the updated context model, the contents of the location within context table 440 storing the particular context model may be replaced with the received updated context model. In one embodiment, only the particular context model will be overwritten. In an alternative embodiment, the entire context table 440 memory address containing the context model will be overwritten; in such embodiments, the received updated context model comprises one or more updated context models and all other unaltered context models stored at the memory address. In one embodiment, write requests include the memory address and/or the context model index to be overwritten.

As described above, retrieved context models requested from context table 440 may be transmitted to context lookup modules 425 and 427, or may be transmitted as retrieved context models 442 and 444 to mux gates 445 and 447, respectively. In the same clock cycle that context lookup modules 425 and 427 request context models from context table 440, context lookup modules 425 may output received even bins 420 as even bins 430 to arithmetic encoding module 460 and context lookup module 427 may output received odd bins 422 as odd bins 432 to arithmetic encoding module 462. In one embodiment, bins 430 and 432 are delayed in the even and odd pipeline, respectively, by one or more clock cycles to arrive at arithmetic encoding modules 460 and 462 at the same clock cycle as selected context models 455 and 457. In one embodiment, the arithmetic encoding modules 460 and 462 receive bins 430 and 432 and associated selected context models 455 and 457 in different clock cycles and delay processing either bins 430 and 432 or selected context models 455 and 457 one or more clock cycles until associated bins and context models can be processed together.

Mux gates 445 and 447 may receive multiple context models as inputs and output a selected context model 455 and 457, respectively. Either mux gate 445 or 447 may receive either context model 442 or 444, or both, and may receive either updated context model 465 or 467, or both. In addition, mux gates 445 and 447 may receive additional context models not shown in FIG. 4, such as context models stored in cache memory, or context models received from an additional module or an external source. In one embodiment, mux gates 445 and 447 transmit context modules between themselves. In addition, mux gates 445 and 447 may be implemented by a single mux gate, which may output both selected context models 455 and 457.

In one embodiment, one or more context models received by mux gates 445 and 447 may comprise a context model word containing multiple context models as stored in a context table 440 memory address. In such embodiments, mux gates 445 and 447 may parse a single context model from the context model word to output as selected context model 455 and 457, or may output the entire context model word as selected context model 455 and 457. Mux gates 445 and 447 may utilize select logic 450 and 452 to select among multiple context models received as inputs to output as selected context models 455 and 457. Select logic 450 and 452 may utilize a variety of factors in selecting a context model, such as context model index, time since last context model update, the most recent version of a particular context model, the source of each context model, or any other factor necessary to select the most relevant context model. The mux gates 445 and 447 may be standalone modules, or may be implemented within arithmetic encoding modules 460 and 462, respectively, or any other module.

Arithmetic encoding modules 460 and 462 encode bins 430 and 432 using associated selected context models 455 and 457. As discussed above, each bin received by an arithmetic encoder has an associated context model, retrieved either from context table 440 or selected among recently updated context models. When an arithmetic encoding module 460 or 462 receives both a bin and an associated context model, the arithmetic encoding module 460 or 462 can encode the received bin. As also discussed above, CABAC encoding may comprise maintaining an interval, updating and/or restricting the interval based on the received bin and associated context model, and outputting an encoded bit if the interval falls in the pre-designated intervals [0, 0.5] or [0.5, 1] and is expanded accordingly. Arithmetic encoding modules 460 and 462 may utilize other methods of encoding received bins, such as outputting an encoded bit when the maintained interval falls in other pre-designated intervals or when the range of the interval falls within a specific magnitude.

CABAC encoding may require sequential bins of a syntax element to be encoded using the same maintained interval. In one embodiment, arithmetic encoding module 460 updates a maintained interval in encoding an even bin 430 and transmits the updated interval as interval 470 to arithmetic encoding module 462 for use in encoding a sequential odd bin 432. In this embodiment, updating the maintained interval in arithmetic encoding module 460, transmitting the maintained interval to arithmetic encoding module 462 as interval 470, and updating the transmitted interval in arithmetic encoding module 462 may occur in a single clock cycle. Alternatively, arithmetic encoding module 462 may utilize prediction logic which predicts the interval updated in arithmetic encoding module 460 for use in encoding an odd bin 432. Receiving the updated interval or a prediction of the updated interval of arithmetic encoding module 460 for a first bin in the clock cycle the updated interval is computed within may allow arithmetic encoding module 462 to encode a second, sequential bin of a syntax element in the same clock cycle as arithmetic encoding module 460 encodes the first bin of the syntax element. If arithmetic encoding module 462 is unable to receive the updated interval from arithmetic encoding module 460 with enough time to encode a sequential bin in the same clock cycle, a pipeline stall may be inserted to delay the subsequent encoding until arithmetic encoding module 462 encodes the sequential bin.

In one embodiment, arithmetic encoding module 462 transmits an updated interval to arithmetic encoding module 460 as interval 470 after arithmetic encoding modules 460 and 462 have encoded bins in a particular clock cycle. The updated interval from arithmetic encoding module 462 allows arithmetic encoding module 460 to encode a sequential bin in the next clock cycle. For example, if arithmetic encoding module 460 receives a first syntax element bin, and arithmetic encoding module 462 receives a second syntax element bin, arithmetic encoding module 460 can encode the first syntax element bin using a maintained interval, and arithmetic encoding module 462 can encode the second syntax element bin in the same clock cycle using, for example, a predicted maintained interval. Arithmetic encoding module 462 may update the maintained interval and transmit the updated interval to arithmetic encoding module 460 in the same clock cycle. In the following clock cycle, arithmetic encoding module 460 may receive the interval 470 from arithmetic encoding module 462, and may use the interval 470 to encode a third syntax element bin.

In the event that arithmetic encoding module 460 and 462 receive bins from different syntax elements in the same clock cycle, arithmetic encoding module 462 may use a different maintained interval or may use the same maintained interval as arithmetic encoding module 460. In the event that arithmetic encoding module 460 and arithmetic encoding module 462 each receive a bin requiring use of the same context model, arithmetic encoding module 460 may update the context model and may provide the updated context model to arithmetic encoding module 462 for use in encoding the received bin in the same clock cycle. Alternatively, arithmetic encoding module 462 may use prediction logic to receive a prediction of the updated context model for use in encoding the received bin in the same clock cycle.

Arithmetic encoding modules 460 and 462 may update received selected context models 455 and 457 after encoding received bins 430 and 432. In one embodiment, updating a context model comprises adjusting the probability of the context model to reflect the value of an encoded bin. Updating context models may comprise adhering to a pre-designated method for adjusting context model probabilities. In one embodiment, received selected context models 455 and 457 comprise context model words containing multiple context models. In such an embodiment, updating context models comprises updating only the particular context model in the context model word used in encoding the received bins, and outputting the remainder of the context model word without alteration.

Updated context models may be outputted as updated context models 465 and 467, and may be transmitted to context table 440, mux gate 445, and mux gate 447. In one embodiment, updated context models 465 and 467 may be transmitted to context table 440 with a write request. The write request may comprise the context model index for the updated context model, the memory address to be written to, a "memory write" signal, and any other control signals required for writing to context table 440.

Arithmetic encoding module outputs encoded bits as even encoded bits 475 and arithmetic encoding module outputs encoded bits as odd encoded bits 477. Encoded bits 475 and 477 are received by pipe combiner module 480. Pipe combiner module 480 combines encoded bits 475 and 477 and outputs compressed bitstream 485. In one embodiment, compressed bitstream 485 comprises encoded bits 475 and 477 combined into a single bitstream in the order they are received. If an even encoded bit 475 is received in the same clock cycle as an odd encoded bit 477, pipe combiner module 480 may output the even encoded bit 475 before odd encoded bit 477 in bitstream 485. If only one encoded bit is received in a particular clock cycle, the received encoded bit is outputted by pipe combiner 480. Pipe combiner 480 may output bits as they are received, or may store received bits and output bits in groups.

Dual-Pipeline CABAC Encoder Implementation

Figure 5:
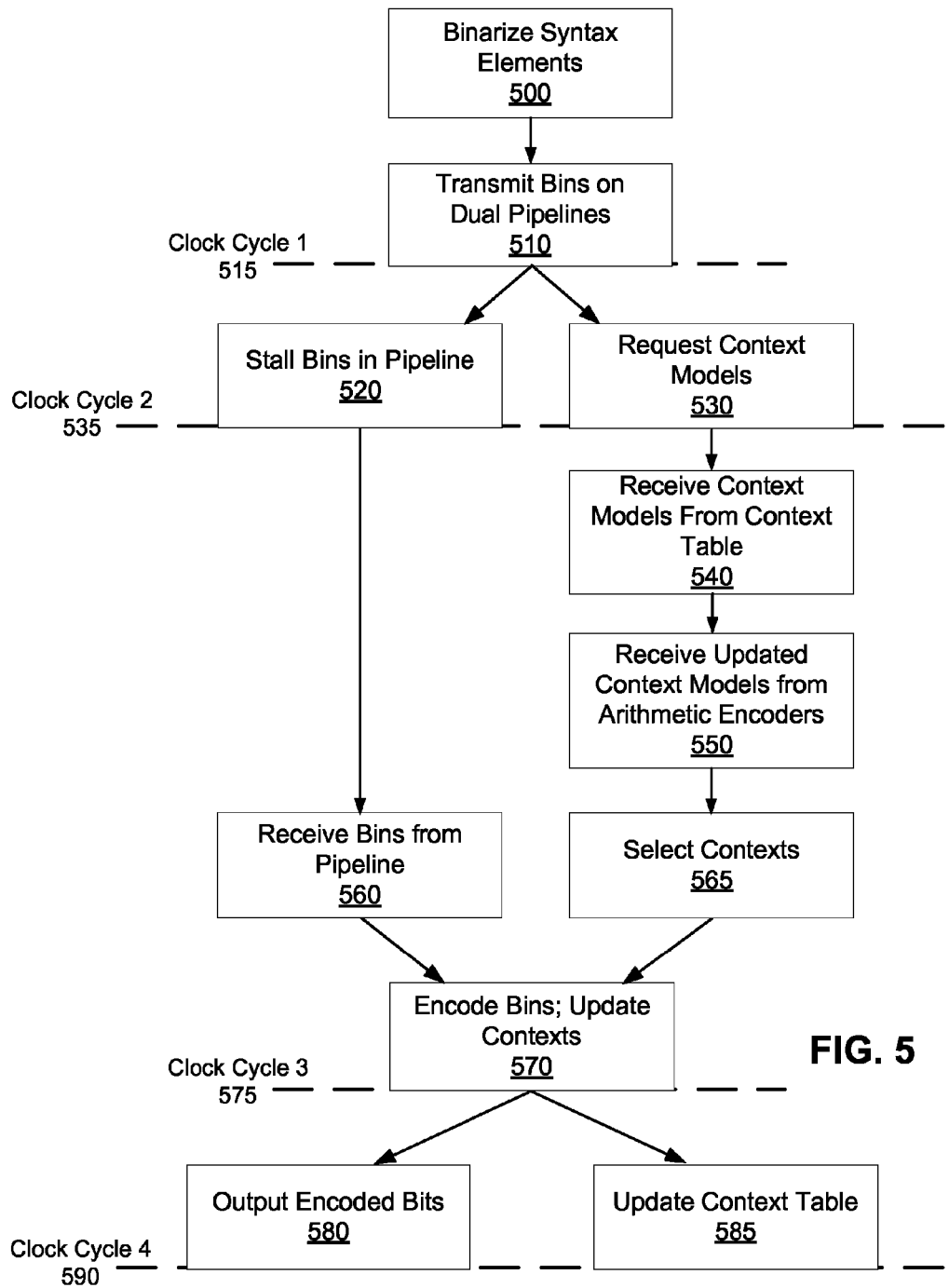
FIG. 5 is a flow chart illustrating steps performed by a video processing system with a dual-pipeline implementation of an H.264 CABAC encoder, according to one embodiment.

FIG. 5 is a flow chart illustrating steps performed by a video processing system with a dual-pipeline implementation of an H.264 CABAC encoder, according to one embodiment. The embodiment described in FIG. 5 is implemented with a 4-clock cycle pipeline. Other embodiments may be implemented with pipelines of fewer or more clock cycles, or may be implemented asynchronously. Further, the described pipelines may be implemented with fewer or more functionalities than the ones described.

In clock cycle 1 515, one or more syntax elements are binarized 500. The binarized syntax elements are then alternately transmitted 510 one or two bins at a time. If one bin is transmitted 510, then the bin may be transmitted to the least recently used pipeline. For instance, if in the previous clock cycle, a bin was transmitted on the even pipeline, a bin may be transmitted on the odd pipeline in the current clock cycle. Alternatively, if one bin is transmitted 510, the bin may be transmitted only on the even or the odd pipeline. If two bins are transmitted 510, the first bin may be transmitted on the even pipeline and the second bin may be transmitted on the odd pipeline. In clock cycle 2 535, transmitted bins are stalled 520 in pipelines. In the same clock cycle, context models are requested 530 from a context table.

In clock cycle 3 575, each pipeline receives 540 context models from the context table and receives 550 updated context models from arithmetic encoders. Additional context models may be received from other modules, such as cache memory or external sources. Each pipeline selects 565 a context model and receives 560 a stalled bin. The received bin is encoded 570 using the selected context model, and the context model is updated. In clock cycle 4 590, encoded bits are outputted 580 and the context table is updated 585 with the updated context model.

Additional Configuration Considerations

Some portions of above description describe the embodiments in terms of algorithmic descriptions and processes. These operations (e.g., the processes described above), while described functionally, computationally, or logically, are understood to be implemented by computer programs or equivalent electrical circuits, microcode, or the like. The computer programs are typically embedded as instructions that can be stored on a tangible computer readable storage medium (e.g., flash drive disk, or memory) and are executable by a processor. Furthermore, it has also proven convenient at times, to refer to these arrangements of operations as modules, without loss of generality. The described operations and their associated modules may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for improving transcoding efficiency, speed and for increasing throughout of coding processing through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for lossless compression of video data in a synchronous pipelined environment, the method comprising:
converting, through binarization, one or more syntax elements into ordered bins, the ordered bins comprising at least a first bin followed by a second bin;
requesting, by a first context model lookup module, a first context model based on the first bin;
requesting, by a second context model lookup module, a second context model based on the second bin;
receiving, at a first encoder coupled to the first context model lookup module, the first bin and the first context model;
receiving, at a second encoder coupled to the second context model lookup module the second bin and the second context model;
encoding, by the first encoder, the first bin based at least in part on the first context model within a clock cycle to produce a first encoded bit;
encoding, by the second encoder, the second bin based at least in part on the second context model within the same clock cycle to produce a second encoded bit;
combining the first encoded bit and a second encoded bit to form an encoded bitstream; and
outputting the one encoded bitstream.

2. The method of claim 1, further comprising:
requesting the first context model and the second context model from a context model table;
updating, by the first encoder, the first context model based at least in part on the first bin;
updating, by the second encoder, the second context model based at least in part on the second bin; and
transmitting the updated first context model and updated second context model to the context model table for storage.

3. The method of claim 2, wherein the context model table comprises one or more context models stored at one or more context model table addresses, and wherein at least two context models are stored at one context model table address.

4. The method of claim 1, wherein the first context model and the second context model comprise the same context model.

5. The method of claim 1, wherein the first encoder and the second encoder are further configured to:
receive multiple context models associated with a bin; and
select one of the multiple context models for use in encoding.

6. The method of claim 5, wherein a context model in the multiple context models most recently used in encoding is selected.

7. The method of claim 1, wherein encoding a bin further comprises:
maintaining a numerical interval comprising an upper interval limit and a lower interval limit, the upper interval limit greater than the lower interval limit, the numerical difference between the upper interval limit and the lower interval limit comprising the range of the numerical interval; and
restricting the range of the numerical interval based on the bin and an associated context model, wherein restricting the range of the numerical interval comprises increasing the lower interval limit or decreasing the upper interval limit.

8. The method of claim 7, wherein producing at least one encoded bit further comprises:
outputting an encoded bit if the upper interval limit falls below a first pre-designated threshold or if the lower interval limit rises above a second pre-designated threshold; and
expanding the range of the numerical interval based on the outputted bit, wherein expanding the range of the numerical interval comprises decreasing the lower interval limit or increasing the upper interval limit.

9. The method of claim 7, wherein encoding the second bin is further based at least in part on the numerical interval maintained in encoding the first bin.

10. The method of claim 1, wherein the method is implemented in an H.264 video encoder.

11. An encoding system for lossless compression of video data in a synchronous pipelined environment, the encoder comprising:
a non-transitory computer-readable storage medium storing executable modules comprising:
a binarization module configured to convert, through binarization, one or more syntax elements into ordered bins, the ordered bins comprising at least a first bin followed by a second bin;
a first context model lookup module configured to request a first context model based on the first bin;
a second context model lookup module configured to request a second context model based on the second bin;
a first encoder coupled to the first context model lookup module and configured to:
receive the first bin and the first context model associated with the first bin; and
encode the first bin based at least in part on the first context model within a clock cycle to produce a first encoded bit;
a second encoder coupled to the second context model lookup module and configured to:
receive the second bin and the second context model associated with the second bin; and
encoding the second bin based at least in part on the second context model within the same clock cycle to produce a second encoded bit; and
an output configured to:
combine the first encoded bit and the second encoded bit to form an encoded bitstream; and
output the encoded bitstream; and
a processor configured to execute the executable modules.

12. The encoding system of claim 11, wherein the first context model lookup module is further configured to request the first context model from a context model table, wherein the first encoder is further configured to update the first context model based at least in part on the first bin, wherein the second context model lookup module is further configured to request the second context model from the context model table, and wherein the second encoder is further configured to update the second context model based at least in part on the second bin.

13. The encoding system of claim 12, wherein the context model table comprises one or more context models stored at one or more context model table addresses, and wherein at least two context models are stored at one context model table address.

14. The encoding system of claim 11, wherein the first context model and the second context model comprise the same context model.

15. The encoding system of claim 11, wherein the first encoder and the second encoder are further configured to:
receive multiple context models associated with a bin; and
select one of the multiple context models for use in encoding.

16. The encoding system of claim 15, wherein the first encoder and the second encoder are further configured to select a context model in the multiple context models most recently used in encoding.

17. The encoding system of claim 11, wherein the first encoder and the second encoder are further configured to:
maintain a numerical interval comprising an upper interval limit and a lower interval limit, the upper interval limit greater than the lower interval limit, the numerical difference between the upper interval limit and the lower interval limit comprising the range of the numerical interval; and
restrict the range of the numerical interval based on a received bin and an associated context model, wherein restricting the range of the numerical interval comprises increasing the lower interval limit or decreasing the upper interval limit.

18. The encoding system of claim 17, wherein the first encoder and the second encoder are further configured to:
output an encoded bit if the upper interval limit falls below a first pre-designated threshold or if the lower interval limit rises above a second pre-designated threshold; and
expand the range of the numerical interval based on the outputted bit, wherein expanding the range of the numerical interval comprises decreasing the lower interval limit or increasing the upper interval limit.

19. The encoding system of claim 17, wherein encoding the second bin is further based at least in part on the numerical interval maintained in encoding the first bin.

20. The encoding system of claim 11, wherein the encoding system is implemented in an H.264 video encoder.

21. An encoding system for lossless compression of video data in a synchronous pipelined environment, the encoder comprising:
a binarization module configured to convert, through binarization, one or more syntax elements into ordered bins, the ordered bins comprising at least a first bin followed by a second bin;
a first context model lookup module configured to request a first context model based on the first bin;
a second context model lookup module configured to request a second context model based on the second bin;
a first hardware encoder coupled to the first context model lookup module and configured to:
receive the first bin and the first context model associated with the first bin; and
encode the first bin based at least in part on the first context model within a clock cycle to produce a first encoded bit;
a second hardware encoder coupled to the second context model lookup module and configured to:
receive the second bin and the second context model associated with the second bin; and
encode the second bin based at least in part on the second context model within the clock cycle to produce a second encoded bit; and
an output module configured to combine the first encoded bit and the second encoded bit to form an encoded bitstream, and to output the encoded bitstream.

22. The encoding system of claim 21, wherein the first context model lookup module is further configured to request the first context model from a context model table, and wherein the first hardware encoder is further configured to:
update the first context model based at least in part on the first bin; and
transmit the updated first context model to the context model table for storage.

23. The encoding system of claim 21, wherein the second context model lookup module is further configured to request the second context model from a context model table, and wherein the second hardware encoder is further configured to:
update the second context model based at least in part on the second bin; and
transmit the updated second context model to the context model table for storage.

* * * * *